United States Patent [19]

Thornton et al.

[11] Patent Number: 4,875,216

[45] Date of Patent: Oct. 17, 1989

[54] BURIED WAVEGUIDE WINDOW REGIONS FOR IMPROVED PERFORMANCE SEMICONDUCTOR LASERS AND OTHER OPTO-ELECTRONIC APPLICATIONS

[75] Inventors: Robert L. Thornton, East Palo Alto, Calif.; Robert D. Burnham, Wheaton, Ill.

[73] Assignee: Xerox Corporation, Stamford, Conn.

[21] Appl. No.: 126,546

[22] Filed: Nov. 30, 1987

[51] Int. Cl.$^4$ .............................................. H01S 3/19
[52] U.S. Cl. .......................................... 372/45; 372/46
[58] Field of Search ....................... 372/43, 44, 45, 46, 372/50

[56] References Cited

U.S. PATENT DOCUMENTS 4,511,408  4/1985  Honoyak, Jr. .......................... 372/45
4,546,480  10/1985  Burnham et al. ...................... 372/45
4,639,275  1/1987  Holonyak, Jr. ......................... 372/46

OTHER PUBLICATIONS

H. Blauvelt et al, "Large Optical Cavity AlGaAs Buried Heterostructure Window Lasers", *Applied Physics Letters*, vol. 40(12), pp. 1029–1031 (Jun. 15, 1982).
H. Yonezu et al, "An AlGaAs Window Structure Laser", *IEEE Journal of Quantum Electronics*, vol. QE-15(8), pp. 775–781 (Aug. 1979).
Y. Suzuki et al, "Fabrication of GaAlAs 'Window Stripe' Multi-Quantum-Well Heterostructure Lasers Utilising Zn Diffusion-Induced Alloying", *Electronic Letters*, vol. 20(9), pp. 383–384 (Apr. 26, 1984).
T. Murakami et al, "High-Power AlGaAs Laser with a Thin Tapered-Thickness Active Layer", *Electronics Letters*, vol. 22(4), pp. 217–218 (Feb. 13, 1986).
K. Meehan et al, "Disorder of an $Al_xGa_{1-x}As$–GaAs Superlattice by Donor Diffusion", *Applied Physics Letters*, vol. 45(5), pp. 549–551 (Sep. 1, 1984).
R. L. Thorton et al, "Highly Efficient, Long Lived AlGaAs Lasers Fabricated by Silicon Impurity Induced Disordering", *Applied Physics Letters*, vol. 49(3), pp. 133–134 (Jul. 21, 1986).
G. R. Antell, "The Diffusion of Silicon in Gallium Arsenide", *Solid–State Electronics*, vol. 8, pp. 943–946 (1965).
E. Omura et al, "Closed–Tube Diffusion of Silicon in GaAs from Sputtered Silicon Film", *Electronic Letters*, vol 22(9), pp. 496–498 (Apr. 24, 1986).
T. Onuma et al, "Study of Encapsulants for Annealing Si-Implanted GaAs", *Journal of Electrochemical Society*, vol. 129(4), pp. 837–840 (Apr., 1982).
M. E. Greiner et al, "Diffusion of Silicon in Gallium Arsenide Using Rapid Thermal Processing: Experiment and Model", *Applied Physics Letters*, vol. 44(8), pp. 750–752 (Apr. 15, 1984).

(List continued on next page.)

*Primary Examiner*—William L. Sikes
*Assistant Examiner*—Georgia Y. Epps
*Attorney, Agent, or Firm*—W. Douglas Carothers, Jr.

[57] ABSTRACT

A window laser having at least one window region with a transparent waveguide layer optically coupled to an active region generating lightwaves. The waveguide layer is characterized by a broader guided transverse mode for the lightwaves than the active region and may have a thickness which is greater than the active region, a refractive index difference with respect to cladding layers which is less than a refractive index difference between the active region and the cladding layers, or both. The waveguide layer may be coupled to the active region via a transition region characterized by a gradual change in the guide mode width of the lightwaves, such as from a tapered increase in thickness of the waveguide layer in a direction away from the active region. The preferred method of making window region having these transparent waveguides is impurity induced disordering, in which the interfaces between active region and cladding layers is disordered by impurity species to produce the waveguide layer with increased bandgap and a graded transverse refractive index profile. The laser is characterized by a high power output beam with reduced far field transverse divergence.

6 Claims, 6 Drawing Sheets

OTHER PUBLICATIONS

K. L. Kavanaugh et al, "Silicon Diffusion at Polycrystalline-Si/GaAs Interfaces", *Applied Physics Letters*, vol. 47(11), pp. 1208-1210 (Dec. 1, 1985).

K. L. Kavanaugh et al, "The Polycrystalline-Si Contact to GaAs", *Journal of the Electrochemical Society*, vol. 133(6), pp. 1176-1179 (Jun., 1986).

N. Holonyak, Jr. et al, "Quantum-Well Heterostructure Lasers", *IEEE Journal of Quantum Electronics*, vol. QE-16(2), pp. 170-186 (Feb., 1980).

R. L. Thornton et al, "High Power (2.1W) 10-Stripe AlGaAs Laser Arrays with Si Disordered Facet Windows", *Applied Physics Letters*, vol. 49(23), pp. 1572-1574 (Dec. 8, 1986).

R. L. Thornton et al, "Impurity Induced Disordering of Heterojunction Interfaces: Phenomenology and Laser Device Applications", *Proceedings of SPIE*, vol. 797, pp. 176-184 (Mar. 23-25, 1987).

R. L. Thornton et al, "Low Threshold Planar Buried Heterostructure Lasers Fabricated by Impurity-Induced Disordering", *Applied Physics Letters*, vol. 47(12), pp. 1239-1241, (Dec. 15, 1985).

BURIED WAVEGUIDE WINDOW REGIONS FOR IMPROVED PERFORMANCE SEMICONDUCTOR LASERS AND OTHER OPTO-ELECTRONIC APPLICATIONS

FIELD OF THE INVENTION

The present invention relates to semiconductor structures having transparent waveguide regions and more particularly to window regions formed in semiconductor lasers, i.e. lasers fabricated with monolithic transparent regions having reduced absorption, such regions being principally located between the mirror facets of the laser and the ends of the active region emitters of the laser.

BACKGROUND OF THE INVENTION

Semiconductor laser arrays have recently attained optical power outputs which make them attractive for many high power applications, such as for pumping solid state lasers. For example, GaAlAs buried heterostructure lasers produced with silicon impurity induced disordering (IID) have achieved low threshold, high efficiencies, and power levels of up to 0.5 watt. One limitation, however, on output power capability for GaAlAs lasers is catastrophic damage to the laser facets or mirrors, due in part to local heating at high output powers from optical absorption in the active regions near the facets. Additionally, at somewhat lower power levels, facet erosion caused by oxidation of the active region may occur thereby reducing the useful life of the laser. It is known that improved catastrophic damage levels can be obtained either by shifting the laser emission to a longer wavelength, i.e. lower energy, relative to the threshold absorption energy at the facet or by increasing the bandgap of the facet material, i.e. the absorption energy at the facet, relative to the laser emission energy. In either instance, regions adjacent to the facets characterized by substantially lower optical absorption are created. These regions are called "windows" and lasers having these facet windows are called "window lasers".

Window lasers have been fabricated by a variety of methods. One method is to introduced a change of material composition by the selective diffusion of zinc into the laser cavity everywhere except at the facets while maintaining a constant thickness waveguide layer. The diffuxed zinc shifts the laser emission to a longer wavelength. The power output of zinc diffuxed window lasers is limited by catastrophic damage due to local heating in the bulk rather than at the facets.

More recently various methods have been used to increase the effective bandgap at the facet, including zinc impurity induced disordering (IID) and etching and regrowth. Blauvelt et al in *Applied Physics Letters,* Vol. 40(12), pp. 1029–1031, June 15, 1982, describe a buried heterostructure window laser produced by the latter method. Portions of the active layer which will eventually form the window regions are removed by selective etching, then a thicker transparent waveguide or window or wider bandgap material is regrown in its place. Yonezu et al in *IEEE Journal of Quantum Electronics,* Vol. QE-15, pp. 775–781, 1979, discloses the use of the Zn diffusion technique in forming a window laser. More recently, Y. Suzuki et al, "Fabrication of GAAlAs 'Window Stripe' Multiple-Quantum Well Heterostructure Lasers Utilising Zn Diffusion-Induced Alloying", *Electronic Letters,* Vol. 20(9), pp. 383–384, Apr. 26, 1984, disclosed the formation of Zn impurity diffusion window regions using $Si_3N_4$ masking in fabricating a single emitter window laser having a multiple quantum well active region.

Another method for increasing the available power level limited by catastrophic facet damage is to grow very thin active layers to lower the optical power density at the facets. In order to avoid increasing the threshold current because of a decrease of gain, nonuniformity of the active layer (for liquid phase epitaxy grown layers), and the influence of the active layer interfaces, the active layer is tapered, i.e. made thinner only near the facets. Burnham et al in U.S. Pat. No. 4,546,480 and Murumaki et al in *Electronics Letters,* Vol. 22(4), pp. 217–218, Feb. 13, 1986, disclose two distinct lasers produced by this technique.

It is desirable, when fabricating window regions in semiconductor lasers, not to significantly increase scattering, propagation and diffraction losses particularly at the transition between the window region and the active region. In order to reduce diffraction loss in the vertical direction perpendicular to the plane of the active region, it is preferred that a waveguide remain in the window regions to confine the light. Window formation techniques, including IID when taken to an extreme extent, may completely destroy any waveguiding capabilities present in the as-grown layers, in particular the vertical waveguiding properties in the window region, since the entire region after such treatment will completely disordered when taken to extreme extent. For example, see the representations concerning this effect in U.S. Pat. Nos. 4,511,408 and 4,639,275 wherein complete disordering treatment is observed. Other window formation techniques, such as etching and regrowth, can introduce abrupt boundaries and transitions that cause large scattering losses. Thinning the active region can cause propagation losses which depend on the degree of thinning and the length of the window regions.

The technique of IID has been developed as a means for crafting semiconductor structures. This technique may be defined as a process of enhanced rate of interdiffusion of ordered elemental constituents as initially formed in consecutively deposited layers of semiconductor compounds or alloys through the introduction, i.e., diffusion of an impurity into the layers. The utility of IID, as discussed in K. Meehan et al, "Disorder of an $Al_xGa_{1-x}As$-GaAs Superlattice by Donor Diffusion", *Applied Physics Letters,* Vol. 45(5) pp. 649–651, Sept. 1, 1984 and in U.S. Pat. No. 4,639,275, is useful in fabricating planar index waveguide structures in multilayer GaAs/GaAlAs semiconductor structures, such as for integrated optical waveguides and heterostructure lasers and array lasers. An example of its application in the fabrication of buried heterostructure lasers is disclosed in the article of R. L. Thornton et al entitled, "Highly Efficient, Long Lived AlGaAs Lasers Fabricated by Silicon Impurity Induced Disordering", *Applied Physics Letters,* Vol 49(3), pp. 133–134, July 21, 1986.

It has been recognized that impurity diffusion into III–V compound semiconductors is an important step in the fabrication of optoelectronic devices. Recently, much attention has been given to the diffusion of Si into GaAs. Also, recently, considerable attention has been given to impurity induced disordering (IID) in GaAs/GaAlAs quantum well structures.

In particular, the diffusion of silicon in GaAs has been uder study and investigation for many years. As an example, G. R. Antell in an article, "The Diffusion of Silicon in Gallium Arsenide", *Solid-State Electronics*, Vol. 8, pp. 943–946 (1965), discloses the diffusion of Si into GaAs carried out at high temperatures in a sealed quartz capsule containing an overpressure of As to prevent the outdiffusion of As from the GaAs. The diffusivity and activation of Si in GaAs is proportional to the As overpressure and the Ga vacancy concentrations. Excess As pressure in a closed ampoule is required for successful diffusion. See, also, the more recent article on this subject of E. Omura et al, "Closed-Tube Diffusion of Silicon in GaAs From Sputtered Silicon Film", *Electronic Letters*, Vol. 22(9), pp. 496–498 (Apr. 24, 1986).

More recently, the effects of encapsulation relative to Si implanted into GaAs have been studied to prevent the outdiffusion from GaAs and provide, in some cases, a source of Si for diffusion into GaAs. See the article of T. Onuma et al, "Study of Encapsulants for Annealing Si-Implanted GaAs", *Journal of Electrochemical Society*, Vol. 129(4), pp. 837–840 (April, 1982). Diffusion of Si was enhanced by $SiO_2$ encapsulation but was negligible with $Si_2N_4$ encapsulation or when capless. The activation of the diffusion process is initiated at high anneal temperatures, such as 750° C. and above. Onuma et al indicates that the $SiO_2$ cap layer is permeable to Ga while the $Si_3N_4$ cap layer is impermeable to Ga and As so that $SiO_2$ permits the diffusion of Ga to provide for Ga vacancies in the GaAs and the substitution of Si. However, due to the deposition method employed, cracks developed in some of the samples when subjected to the subsequent high temperature annealing process.

M. E. Greiner et al in the article, "Diffusion of Silicon in Gallium Arsenide Using Rapid Thermal Processing: Experiment And Model", *Applied Physics Letters*, Vol. 44(8), pp. 750–752 (Apr. 15, 1984) examines Si diffusion from a thin elemental deposited source thereof using rapid thermal processing with several different encapsulants. The results show that diffusion was dependent on the type of encapsulant. The Si source layer and the encapsulants were deposited at relatively low temperatures, i.e. below 450° C., with subsequent annealing being accomplished at high temperatures of 850° C.-1050° C. High concentrations of Si diffused into GaAs resulted from a $SiO_2$ capped thin Si source layer. In particular, a model proposed by Greiner et al explains that paired Si atoms can move substitutionally by exchaning sites with either Ga or As vacancies which explains the enhanced diffusion when using an $SiO_2$ cap.

More recently, K. L. Kavanagh et al in the articles, "Silicon Diffusion at Polycrystalline-Si/GaAs Interfaces", *Applied Physics Letters*, Vol. 47(11), pp. 1208–1210 (Dec. 1, 1985) and "The Polycrystalline-Si Contact to GaAs", *Journal of the Electrochemical Society*, Vol. 133(6), pp. 1176–1179 (June, 1986), reveals that, under proper conditions, the addition of As to the Si source layer revealed further enhanced diffusion, i.e. greater concentrations of Si into the GaAs. These conditions called for depositing hydrogenated amorphous Si (a-Si:H) onto GaAs in a silane plasma at 450° C. and subsequent annealing at temperatures between 600° C.-1020° C. The results showed that high level interdiffusion of Si atomic pairs with Ga and As vacancies occurs when As is initially added to the Si source layer. However, the surface area of films deposited onto GaAs continued to have a large number of randomly spaced bubbles, indicative of compressive stresses in the film, developed after the high temperature annealing process.

In copending patent applications Ser. Nos. 117,593 and 117,596, filed on Nov. 5, 1987, assigned to the same assignee herein and incorporated herein by reference thereto, it has been recognized that complete disordering in selected regions of deposited layers of semiconductor compounds or alloys can be prevented by controlled IID so that partial disordering will occur on a reproducible basis forming integrated transparent waveguide sections in a monolithic opto-electronic device or chip. In application Ser. No. 117,593, a thin film bilayer composite source is deposited on a semiconductor structure for incorporating an impurity species or dffusant, such as Si, with the level of impurity incorporation and the depth of impurity penetration into the crystal bulk being reproducibly controlled by IID processing employing a thermal anneal treatment. In application Ser. No. 117,596, a thin film bilayer composite source is deposited on a semiconductor structure for incorporating an impurity species or dffusant, such as Si, with the level of impurity incorporation and the depth of impurity penetration into the crystal bulk being reproducibly controlled by IID processing employing a rapid thermal anneal (RTA) treatment followed by a slow thermal anneal (STA) treatment. An object of the present invention is to produce a semiconductor window laser using IID without substantial scattering, propagation and diffraction losses in the laser cavity and, in particular, rendering the window region of the laser nonabsorbing to radiation wavelength of the active region while incorporating a refractive index waveguiding mechanism in the window regions of such lasers.

DISCLOSURE OF THE INVENTION

According to this invention, a semiconductor structure includes at least one window region having a radiation propagating with layer transparent single mode waveguide properties. The presence of such a transparent waveguide layer in the window region of a window laser, while providing for broadened guided mode for lightwaves, reduces the optical power density at the mirror facets of the laser thereby enabling a high power output to be achieved without catastrophic failure. The broadened mode that is supported by the transparent waveguide layer also results in a reduced far field divergence in the transverse direction normal to the plane of the active region, i.e. a transverse divergence which is substantially less than the divergence from lasers without a broadened mode.

Both the active region and the transparent waveguide layer are bounded by semiconductor cladding layers characterized by indices of refraction which are less than the indices of refraction of the active region and the transparent waveguide layer, i.e., both act as waveguides. However, the transparent waveguide layer has an effective bandgap which is greater than that of the active region, so that the waveguide layer is transparent to lightwaves generated in the active region. Further, as already noted, the transverse waveguiding of the transparent waveguide layer is weaker than the transverse waveguiding of the active region to which it is optically couples, so that the guided transverse mode is broadened for layers of similar lateral extent. This may be accomplished by giving the transparent waveguiding layer a thickness which is greater than the thickness of the corresponding portion of active region or by making the refractive index difference between the cladding layers and active region greater than the refractive index difference between the cladding layers and the transparent waveguide layer, or both. Typically, two window region are adjacent to the pair of end facets, and the active region is centered between the two window regions, although other configurations may be made.

To reduce scattering losses, the transparent waveguide layer is preferably optically coupled to the active region via a transition region characterized by a gradual change rather than an abrupt step, in the guided mode width of the lightwaves, as for example from a tapered thickness of the transparent waveguide layer. Window regions having transparent waveguide layers can be produced by impurity induced disordering (IID), i.e. the diffusion of silicon, zinc, tin, germanium, sulfur or other impurity species through the semiconductor layers to form the transparent waveguide window region. As a result, the interfaces between the transparent waveguide layer and adjacent layers are partially disordered or are smeared, only in part, while the masked active region is not diffused with impurity species so that it remains in its ordered state. Thus, an important aspect of this invention is the use of the bilayer source diffusion and thermal treatment techniques as taught in patent application Ser. Nos. 118,593 and 117,596 in forming transparent waveguide window region co-axially aligned with the emitter or emitters formed in a laser structure.

Thus, this invention relates to a buried planar passive waveguide structure formed in a plurality of semiconductor planar layers each comprising different elemental constituents, one of the layers within the structure having a lower energy bandgap than layers immediately adjacent thereto. A one dimensional transparent waveguide is formed in the one layer by IID in combination with the immediately adjacent layers forming a longitudinal waveguide along at least a portion of the layer having the highest refractive index at its core with diminishing refractive index from its core into adjacent layers and nonabsorbing to the radiation wavelength of a monolithically coupled active region.

The resulting laser structure produces an output light beam with a far field divergence perpendicular to the plane of the active region of less than 25 degrees and with a continuous wave power of at least two watts without catastrophic facet damage. Up to 22 watts peak power output in the pulsed mode has been attained.

Other objects and attainments together with a fuller understanding of the invention will become apparent and appreciated by referring to the following description and claims taken in conjunction with the accompanying drawings.

DETAILED DESCRIPTION OF THE INVENTION

A center of focus of this application is multiple array lasers and the capability of fabricating low loss one dimensional window regions in such laser structures, which is equally applicable to single emitter window lasers as well as multiple emitter lasers. Further, the waveguide window regions of this invention may also be applicable to semiconductor devices other than lasers and window regions for lasers, such as, passive waveguide regions for on-board optical communication in opto-electronic integrated chips. However, in order to fully appreciate the structural aspects of this one dimensional or vertical waveguiding mechanism, it is also important to understand its fabrication employing IID techniques taught in patent application Ser. Nos. 117,593 and 117,596 incorporated herein by reference thereto. What follows is a brief description of this technique relative to FIGS. 8 and 9, followed by the description of the window laser 10 comprising this invention and shown in FIG. 1.

Figure 8:
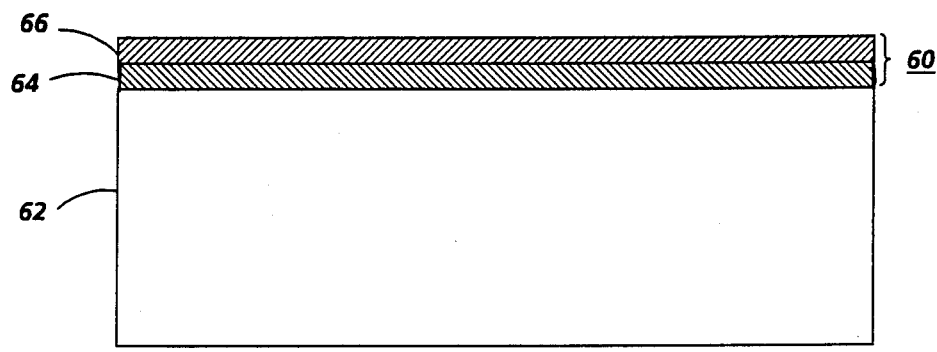
FIG. 8 is a side elevation of a thin film composite source deposited on a substrate to explain the fabrication of the laser comprising this invention.

Reference is now made to FIG. 8 wherein there is shown the thin film bilayer composite source 60 deposited on a semiconductor structure 62. Structure 62 may be a III-V compound or alloy comprising III-V compositional constituents (e.g., Ga, As and/or Al) or may be comprised of one or more or a series of III-V layers or may be a III-V substrate, e.g. GaAs. Source 60 consists of two deposited layers having preferred deposited characteristics and comprises an impurity source layer 64 heavily doped with a diffusion enabling agent and a cap passivating layer 66. Impurity source layer 64, may be, for example, Si or Ge heavily doped with As, P or Sb and passivating layer 16 may be comprised of $Si_3N_4$, $SiO_2$, AlN or $SiO_xN_y$. Other impurity species that also may be applicable to enhance the interdiffusion of compositional constituents, e.g. Ga and Al, would the presence of a high number of defects (besides the presence of vacancies or even proten damage in structure 62) in form of shallow or deep impurities such as Se, Sn, O, S, Be, Te, Si, Mn, Cd, Sn or Cr. Also, these defects could be additions from other column III-V elements, such as, B, N, Al, Ga or In. In the preferred embodiment, impurity source layer 64 is comprised of Si doped with As in the range of 5-20 atomic per cent and a thin cap layer 66 of $Si_3N_4$. Si is preferred because it will deposit in a polycrystalline state using high temperature MO-CVD processing whereas Ge will tend to deposit more crystalline at such temperatures and, therefore, a more tightly packed molecular structure, which is not as desirable for an impurity source layer. $Si_3N_4$ is preferred because of its high level of impermability to III-V elements, e.g. Ga and As, whereas $SiO_2$, for example, permits some outdiffusion of Ga. It appears that some outdiffusion of Ga without any outdiffusion of As from structure 62 is desirable for efficient enabling of the Si diffusion process. In the case of source 60, distribution of Si and Ga occurs between impurity source layer 64 and structure 62.

Bilayer composite source 606 is deposited at high temperatures, i.e. at temperatures in excess of 500° C., in a MO-CVD reactor. Temperatures in excess of 500° C. also happen to approximate the point at which the elemental constituents of III-V compounds will begin to dissociate. A typical example of the deposition process is as follows: Structure 62 for the purposes of this example is a GaAs substrate which is positioned on the susceptor of a MO-CVD reactor. The run temperature of the reactor is set at 678° C., which is approximately the temperature existing at the reactor susceptor where chemical deposition will take place. This temperature is maintained throughout the deposition of layers 64 and 66. The deposition of these layers may be in the range of 500° C.-900° C., preferably in the range of 600° C.-800° C.

The first layer deposited is polycrystalline Si in the presence of a heavy concentration of As. $SiH_4$ is fed into the reactor at 20 sccm with 10% $AsH_3$ at 500 sccm via a carrier gas of $H_2$ at 30 sccm. 10% $AsH_3$ means that the $AsH_3$ gas is 10% diluted in $H_2$ gas. The flow of these gases ($SiH_4 + AsH_3 \rightarrow Si(As)$) is maintained for about five minutes to produce a deposited layer 64 on structure 62 being about 400 Å thick film of poly Si doped with As at about 10 atomic percent.

Next, the source of 10% $AsH_3$ is reduced to 200 sccm and the flow of $NH_3$ gas is commenced and fed into the reactor at 90 sccm with $SiH_4$ flow still at 20 sccm in the same carrier gas concentration of $H_2$ at 30 sccm. The continued flow of $AsH_3$ is optional and, therefore, may be discontinued. However, it is believed that its presence may help to prevent any As outdiffusion from substrate 62 and deposited layers 64.

The flow of gases is maintained for 25 minutes to produce a deposited layer 66 comprising about 400 Å film of $Si_3N_4$ ($SiH_4 + NH_3 \rightarrow Si_3N_4$). Layer 66 should remain relatively thin, e.g. within the range of 400 Å–700 Å. It is preferred that layer 66 be sufficiently thick to prevent any substantial outdiffusion of Ga or As from structure 62 or layer 64. The thickness of impurity source layer 64 is not critical. The range of thickness for layer 14 in our work has been about 200 Å–400 Å. Layer 64, however, should be sufficiently thick to provide sufficient Si source to ensure good diffusion penetration of Si during subsequent high temperature annealing. On the other hand, layer 64 should not be so thick as to introduce thermal strain effects that may result in anomalous diffusion profiles. While such anomalous diffusion has been found not to occur with the application of high temperature impurity source CVD prior to high temperature annealing, a diffusion source layer too thick could introduce such strain effects.

After the growth of source 60, structure 62 is placed in a quartz tube inside a standard heating over. The diffusion depth of si into GaAs substrate 62 proceeds approximately as the square root of the annealing time. As an example relative to the above described deposition of source 60, annealing at 10 hours at 850° C. produces a diffusion depth of approximately 1.4 μm in GaAs substrate 62. The annealing may be carried out generally in the range of 700° C.–900° C., although there may be some overlap at either end of this range.

If the technique of rapid thermal annealing (RTA) is employed, e.g. as disclosed in U.S. patent application, Ser. No. (D/87206), a temperature in the range of 900° C.–1100° C. may applied for 10–175 seconds. After this RTA treatment, structure 62 is further annealed employing the slow thermal annealing (STA) treatment at a temperature in the range of 700° C.–900° C. for several hours, such as 4 to 10 hours.

Figure 9:
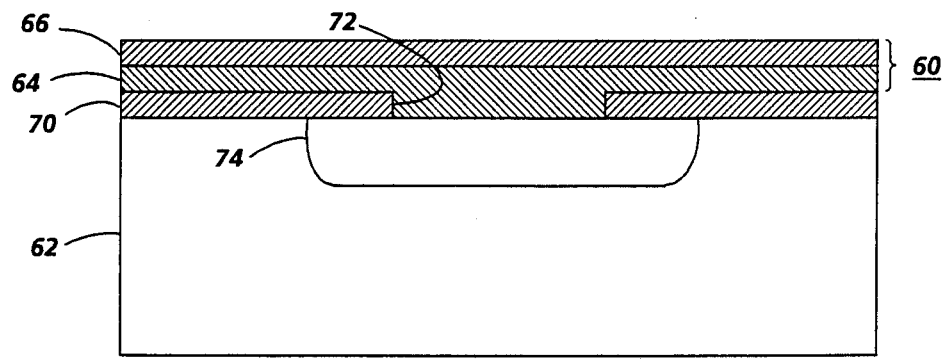
FIG. 9 is a side elevation of a thin film composite source of FIG. 8 deposited on a masking layer which is deposited on a substrate.

Bilayer diffusion source 60 may be applied in combination with masking techniques to provide for selective patterning of impurity diffusion into a semiconductor structure. Such a patterned diffusion source is illustrated in FIG. 9. Prior to the deposition of source 60, a masking layer 70 of $Si_3N_4$ is deposited on the surface of semiconductor structure 62. Layer 70 is deposited in the same manner as previously explained relative to cap layer 66. After its deposition, structure 62 is removed from the MO-CVD reactor and a selective etch is performed in layer 70, using techniques as known in the art, to produce pattern 72 by removing portions of $Si_3N_4$ film 70 to expose surface regions of structure 62. Next, source 60 is deposited in a MO-CVD reactor, in a manner as previously explained relative to FIG. 8, followed by annealing at a temperature, such as 825° C., or, alternatively, followed by RTA at a temperature of 1000° C. for about 100 seconds and STA at a temperature of 850° C. for about 10 hours.

Figure 1:
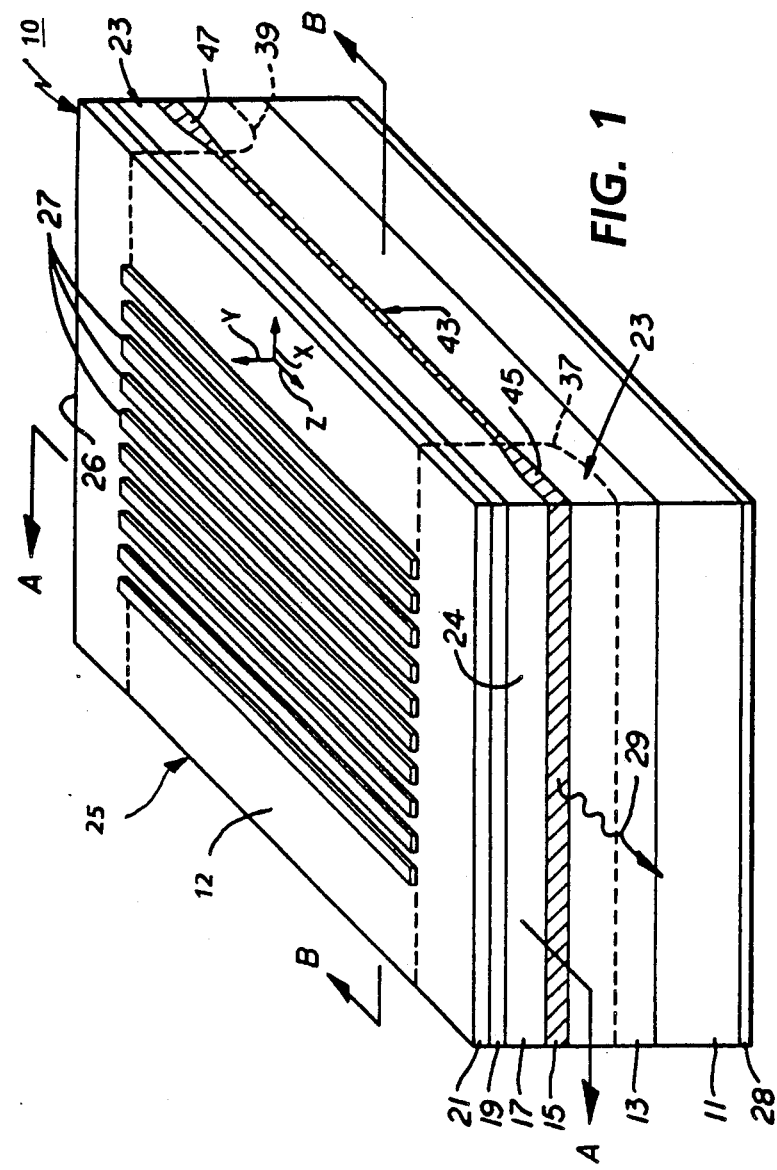
FIG. 1 is a perspective view of a semiconductor window laser of the present invention.
Figure 10:
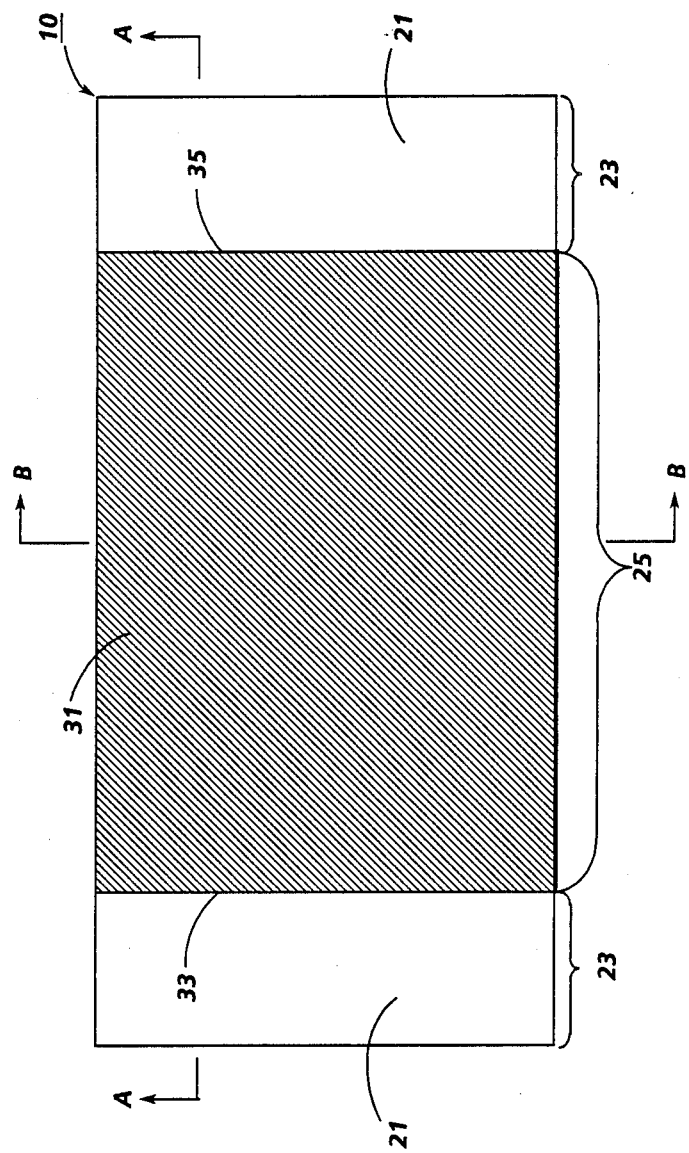
FIG. 10 is a schematic elevation of semiconductor window laser of FIG. 1 for the purposes of illustrating the masking pattern used in fabricating the laser.

In FIG. 10, there is illustrated a masking pattern 31 employed for forming window regions in window laser 10 shown in FIG. 1. Details relative to fabrication of window laser 10 will be discussed later after first discussing details of laser structure.

Reference is now made to FIG. 1, a semiconductor window laser 10 comprises a plurality of contiguous semiconductor layers including a substrate 11, a lower cladding layer 13, one or more layers 15 which together form an active region 45 and transparent waveguides 47 and 49, a first upper cladding layer 17, a zinc diffused second upper cladding layer 19 and a cap layer 21. The laser is thus a monolithic structure of semiconductor layers 13, 15, 17, 19 and 21 formed over a single substrate 11. A pair of end facets 24 and 26 on opposed ends of the laser form partially reflective mirror surfaces defining a resonant optical cavity in the semiconductor body therebetween. The resonant optical cavity may be defined by distributed feedback of lightwaves. The laser is preferably fabricated on a wafer substrate by metal organic chemical vapor (MO-CVD) deposition, but may also be fabricated by liquid phase epitaxy, molecular beam epitaxy or other known crystal growth processes.

For purposes of discussion, three mutually perpendicular directions, indicated by arrows, X, Y and Z, are defined. A "lateral" direction is indicated by arrow X. A "transverse" direction, perpendicular to the plane of the active region 43 and extending through the various semiconductor layers, is indicated by arrow Y. A "longitudinal" direction, extending from facet 24 to facet 26 and vice versa, is indicated by arrow Z.

The laser has at least one window region 23 having a transparent waveguide layer 15. In FIG. 1, two window regions 23 with transparent waveguides 45 and 47 are seen, the window regions being adjacent to the pair of end facets 24 and 26 with active region 43 being centered between the two window regions 23. Lasers with other numbers and positions of window regions 23 may also be fabricated. The window regions 23 in FIG. 1 are preferably formed by IID, the dashed lines 37 and 39 demarcating the approximate extent of impurity diffusion.

The laser also includes conductive contact stripes 27 on a top surface 12 and a conductive layer 28 on substrate 11 for forward biasing the laser to inject current into active region 43. Injecting current into the active region causes lightwaves to be generated which then propagate in the resonant optical cavity under lasing conditions. Transparent waveguide layers 45 and 47 are optically coupled to the active region 43. The transparent waveguide layers 45 and 47 are weaker transverse waveguides than the active region 43, and so they are characterized by a broader guided transverse mode than the active region. As a result, a light output beam 29 is produced with a broader transverse near field profile and a substantially lower transverse far fiedl divergence than lasers with the active region 43 extending to the mirror facet 24 and 26. Output beams 29 may be emitted from either one or both of the facets 24 and 26.

In addition to transverse waveguiding, the laser may also include structures which provide lateral waveguiding. For example, in FIG. 1, contact stripes 27 provide a mechanism for gain guiding. Other waveguide structures can include buried heterostructure waveguides, channeled substrate planar waveguides, impurity induced disordering waveguides, mesa substrate index guides, ridge waveguides, rib waveguides, and other structures know in the art. The laser may also be a broad area laser In such cases, the transparent waveguide layer supports a broader transverse mode than said active region of similar lateral extent, i.e. a transparent waveguide portion at one lateral position supports a broader transverse mode than the corresponding active region portion to which the transparent waveguide portion optically couples.

Figure 2:
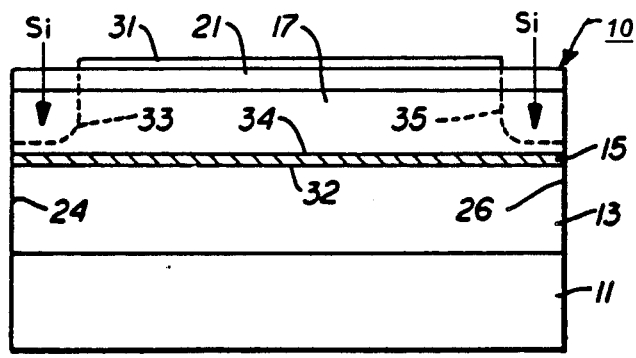
FIGS. 2-4 are side sectional views taken along the line A—A in FIG. 1 and help to illustrate a method for fabricating the laser shown in FIG. 1.

FIGS. 2-5 show one method of fabricating the laser of FIG. 1. With reference to FIG. 2, semiconductor layers 13, 15, 17, 19 and 21 are first grown on substrate 11 using one of the known crystal growth processes mentioned above. Lateral waveguide structures may be formed at this step using known techniques. Substrate 11 is typically composed of n-GaAs. Lower cladding layer 13 is typically composed of n-$Ga_{1-x}Al_xAs$, where x is usually about 0.4, with a doping level in a range from $10^{17}$ to $10^{18}$ cm$^{-3}$ (Se) and a thickness generally about 1.0 μm. Upper cladding layer 17 is typically composed of p-$Ga_{1-y}Al_yAs$, where y is about 0.3, and the doping level is in a range from $10^{17}$ to $10^{18}$ cm$^{-3}$ (Mg). The thickness of upper cladding layer 17 may vary depending on the type of lateral waveguide structure to be formed, if any, but typically ranges from 0.8 μm to 1.5 μm. Cap layer 21 is typically composed of p-GaAs with a thickness of about 0.1 to 0.5 μm. Composition variations are permissible.

Layer or layers 15 may or may not be intentionally doped and might consist of four 50 Å to 150 Å thick quantum wells of GaAs alternating with three 30 Å to 150 Å thick barriers of $Ga_{0.8}Al_{0.2}As$. Such quantum well structures are known and described in an article by N. Holonyak, Jr. et al, entitled "Quantum-Well Heterostructure Lasers" in *IEEE Journal of Quantum Electronics*, Vol QE-16(2), pp. 170-186 February, 1980. Alternatively, instead of a plurality of thin layers in a quantum well or multiple quantum well heterostructure, layer 15 may be formed of $Ga_{1-w}Al_wAs$, where w is typically less than 0.1. In any case, layer or layers 15 with the highest effective index of refraction and lowest effective band gap, forms a transverse waveguide which after completion of the laser fabrication will comprise, as seen in FIG. 1, an active region 43 for lightwave generation and propagation under lasing conditions and at least are transparent waveguide 45 and 47 optically coupled to the active region. By "effective" index of refraction and bandgap of an active region comprising thin quantum well and barrier layers, each with their own absolute indices of refraction and bandgaps, we mean the measured index of refraction and bandgap values for a corresponding single semiconductor active layer that produces an output most similar to the active region. The index of refraction is greatest for active region 43 and transparent waveguides 45 and 47, and lowest for cladding layers 13 and 17.

It will, of course, be recognized that the conductivity type of the layers may be reversed from those noted above. Likewise, instead of GaAs and GaAlAs, other light emitting semiconductor materials, such as GaAlSb, InP, InGaAsP, other Group III-V compounds, Group II-VI compounds and Group IV-VI compounds may be used. Moreover, the dimensions, doping levels, compositions and dopants mentioned above are exemplary only.

After the growth of the semiconductor layers, the wafer is removed from the growth chamber, and an impurity species, such as silicon, zinc or tin, is diffused into the semiconductor layers. With reference to FIG. 10, cap layer 21 is covered with a protective masking pattern 31 of $Si_3N_4$ between dashed lines 33 and 35. Protective layer 31 is either selectively removed from over areas where window regions are to be formed, such as by lithographic pattern development of a photoresist followed by etching in a standard etchant solution, or is not formed in the regions where window regions are to be formed by using conventional masking techniques during the growth of mask 31. Next, silicon may be driven into the semiconductor layers from the surface or implanted. In this particular treatment here, bilayer source 60 is applied over mask 31 and layer 21, followed by the previously described anneal treatment or combination RTA/STA treatment. By varying the implantation dose, the annealing temperature, the type of impurity, and the diffusion time, the depth of impurity diffusion, and consequently the disordering depth can be varied to produce a desired amount of disordering or smearing of the active region/cladding interfaces 32 and 34. The actual diffusion time will vary depending on how deep below the surface the active region layers 15 lie. However, as the diffusion time lengthens, the degree of disordering increases, and any remaining waveguide becomes so weak as to first support multimode propagation and eventually lead to large deffraction losses. It is the intent of the present invention that IID occur to a point just sufficient to produce a transparent single mode waveguide.

In the previously mentioned example using source 60, Si is driven into the as-grown structure at a temperature of about 850° C. from the surface into the semiconductor layers below to an electrical concentration level of about $3 \times 10^{18}$ cm$^{-3}$. Diffusion times are preferably in a range from about 8 to 10 hours for an active region about 1 μm below the surface of the crystal. Diffusion times greater than about 10 hours will produce waveguides which are too weak to support single transverse mode propagation. Different impurity species have different diffusion rates so that different temperatures and diffusion times are necessary. Alternatively, the enhanced method of RTA/STA treatment may be employed.

After the IID treatment has been performed, source 60 and masking layer 31 are removed from the surface of as-grown laser 10 using conventional techniques.

Figure 3:
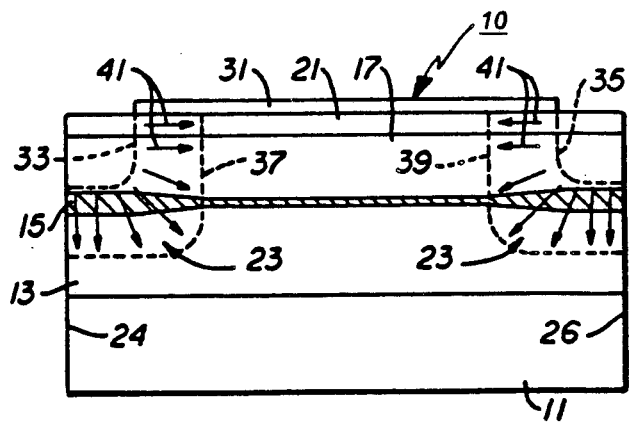

In FIG. 3, the impurity diffusion profile front is indicated by arrows 41. The impurity diffuses through layer 15, the approximate extent of diffusion being indicated by dashed lines 37 and 39, thereby forming window regions 23 with transparent waveguide layers formed from layer 15. Several changes to layer 15 occur to create transparent waveguide layers 45 and 47, seen in FIG. 4. These changes include an increase in thickness in waveguide layer 15 due to the interdiffusion of AL and Ga between adjacent heterostructure layers so that transparent waveguides 45 and 47 are thicker than active region 43. Also, waveguides 45 and 47 have a core or center that is slightly higher in refractive index and decreases in refractive index in the Y direction away from the core. This change is brought about by partial disordering with the least amount of disordering having occurred at the waveguides cores of window regions 23. Another change that occurs is a decrease in the refractive index difference between waveguide layer 15 and cladding layers 13 and 17 so that the refractive index difference between active region 43 and cladding layers 13 and 17 bounding active region 43 is greater than the refractive index difference between transparent waveguides 45 and 47 and cladding layers 13 and 17 bounding the transparent waveguides.

Figure 4:
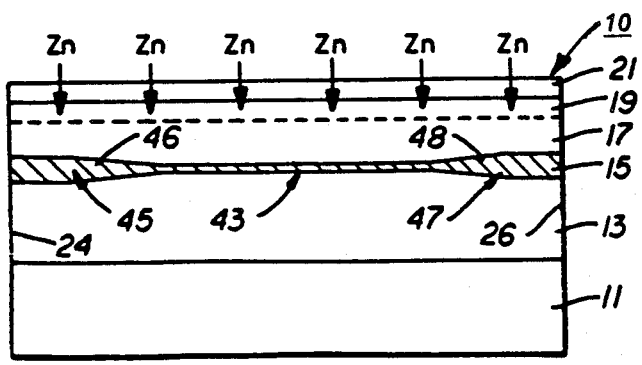
Figure 4A:
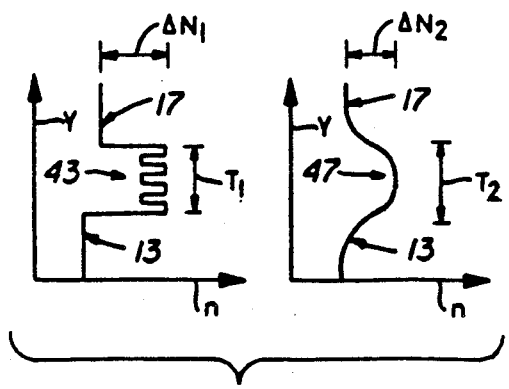
FIG. 4A is a plot of index of refraction versus transverse position for the semiconductor layers in the laser of FIG. 4.
Figure 5:
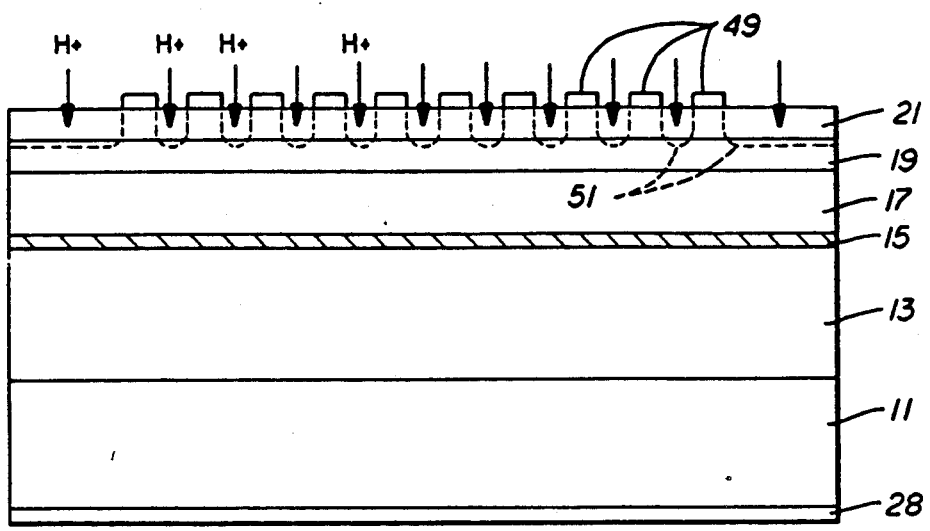
FIG. 5 is a sectional view taken along line B—B in FIG. 1.

In FIG. 4A, these thickness and index of refraction changes are indicated on graphs of index of refraction, n, versus transverse position, Y. In the left hand plot, active region 43 may be a multiple quantum well structure with alternating layers of GaAs and $Ga_{0.8}Al_{0.2}As$ with an index of refraction which is highest, typically about 3.55, for the thin GaAs layers, and slightly lower for the thin $Ga_{0.8}Al_{0.2}As$ layers. Cladding layers 13 and 17 with typical compositions of $Ga_{0.6}Al_{0.3}As$ respectively have lower indices of refraction than the active region 43 which they bound. The thickness $T_1$ of active region 43 is typically in a range from 0.03 $\mu$m to 0.1 $\mu$m. The active region-to-cladding refractive index difference $\Delta N_1$, is typically about 0.005.

IID causes aluminum atoms in the cladding layers to diffuse across the interfaces into the waveguide layer, partially disordering the interface. This produces an increase in the effective bandgap of layer 15 thereby making the waveguide 47 transparent to lightwaves generated in active region 43. IID also causes a decrease in the refractive index difference so that, as seen in FIG. 4A, the refractive index difference $\Delta N_2$ between transparent waveguide layer 47 and cladding layers 13 and 17 bounding transparent waveguide layer 47 is less than the refractive index difference $\Delta N_1$. As indicated above, transparent waveguide layer 47 is characterized by a graded transverse refractive index profile, as shown in the right hand plot, with a maximum index of refraction being located near the core of transparent waveguide layer 47. Thickness $T_2$ of transparent waveguide layer 47 is also seen to be greater than thickness $T_1$ of active region 43.

Referring again to FIG. 4, transparent waveguide layers 45 and 47 are typically optically coupled to the active region 43 via transition region 46 and 48 characterized by a gradual change in the guides transverse mode width of the lightwaves. The thickness and typically the effective bandgap of the transparent waveguide layers 45 and 47 may be tapered, i.e. may gradually increase, from values in the active region 43 to higher values in window regions 23. The change in refractive index difference noted above may also be gradual through a transition region. Alternatively, one or more of these parameters may be abruptly stepped.

After formation of window regions 23, zinc is diffused into cap layer 21 and typically also into the top portion of cladding layer 17 to form second upper cladding layer 19. Zinc diffusion, indicated in FIG. 4 by arrows labeled Zn, provides a low resistance contact surface for current injection. Next, with reference to FIG. 5, the surface of cap layer 21 is selectively implanted with protons H+ to confine the current to stripe regions 49 between implants 51. The wafer is metallized to produce ohmic contacts 27 and 28 to the cap layer 21 and substrate 11 respectively. Contact layer 28 is typically composed of Au/Ge alloy. Contacts 27 are typically composed of Ti/Pt/Au alloy. The bars are cleaved into individual laser die with end facets 24 and 26 in FIG. 1 being defined by the cleavages, and mounted onto copper heatsinks with indium solder, the cap layer 21 side being bonded to the heatsink. The mirrors 24 and 26 may be coated with a dielectric material, such as $Al_2O_3$, to produce a high reflectivity rear facet 26, typically having a reflectivity of about 95%, and to produce a low reflectivity front facet 24, typically having a reflectivity of about 5%. Such a coating has a thickness of approximately one-quarter wavelength of the lightwaves in the dielectric material, i.e. a thickness of about $\lambda/4n$, where $\lambda$ is the wavelength of the lightwaves in a vacuum and n is the index of refraction of the dielectric material. Alternatively, facets 24 and 26 remain uncoated.

Figure 6:
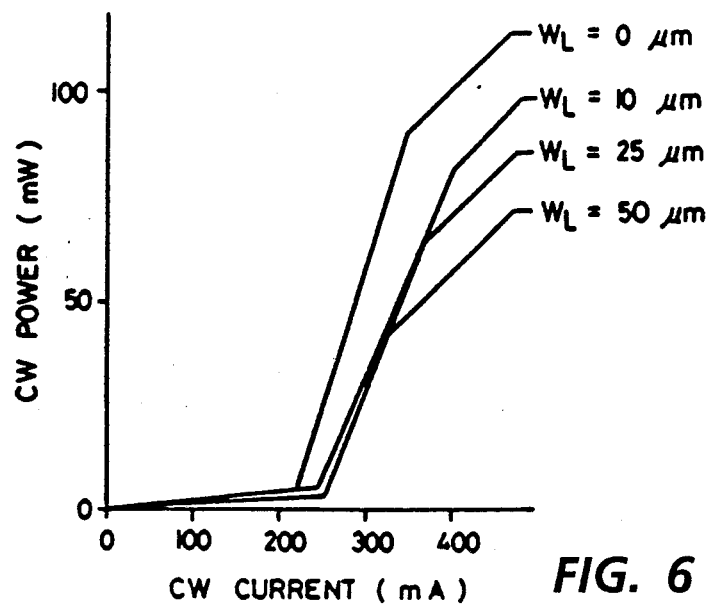
FIGS. 6-7 are CW output power versus current curves for comparing optical output for the laser of similar construction ($W_L = 0$ $\mu$m).

With reference to FIG. 6, the light output power versus current characteristic for typical devices of varying window region lengths is shown. The typical laser used for the measurements is a 10 stripe array with a 100 $\mu$m wide aperture. For a nonwindow laser of like construction (window length $W_L=0$) the threshold current is typically about 225 mA and the slope efficiency is about 0.72 mW/mA. Introduction of a window region results in a laser ($W_L=10$ $\mu$m) with a threshold current of about 265 mA, i.e. about 17% higher than the threshold current of a nonwindow laser. The slope efficiency also decreases by about 25% to about 0.54 mW/mA. However, the decreases in performance are not dependent on the length of the window region as lasers with $W_L=25$ $\mu$m and $W_L=50$ $\mu$m have approximately the same threshold current and slope efficiency as lasers with window length $W_L=10$ $\mu$m. This indicates that propagation losses and diffraction losses are not significant, since both are distributed losses which would be dependent on the window region length, and that the transparent waveguide layer provides a low loss mechanism for lightwave propagation. It is believed that the measured losses are due nearly entirely to scattering losses at an abrupt waveguide discontinuity from the different transverse mode widths supported by window and active regions. This loss is reduced for lasers using tapered transition regions coupling the window regions to the active regions.

Figure 7:
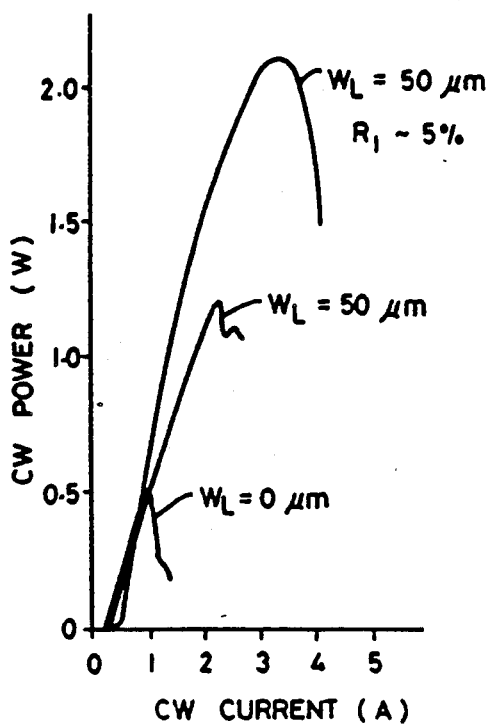

With reference to FIG. 7, the optical power output vs. current is shown for lasers driven to their catastrophic damage levels. For a nonwindow laser ($W_L=0$ $\mu$m), the catastrophic damage level is typically about 530 mW cw at a current level of about 1 A. For a window laser with a window length $W_L$ equal to about 50 $\mu$m, the catastrophic damage level is about 1.2 W cw at a current level of about 2.5 A. Further, by applying a quarterwave antireflection coating to the front mirror facet of the window laser, so that the front facet reflectivity $R_1$, is lowered to about 5%, a maximum power output of about 2.4 W cw is obtained. The rollover in the light output power versus current characteristic is due to thermal heating in the device, and this curve retraces itself when the current is decreased. In order to determine the catstrophic power limit, the diode laser may be operated in a pulsed mode. Using a 100 μs pulse, a 3.5 W catastrophic power limit is observed. The catastrophic power limit is approximately constant for pulse widths grater than about 1 μs, i.e. for quasi-continuous wave operation. For times less than 1 μs, the peak temperature at the facets decreases with decreasing pulse width, resulting in a catastrophic power limit which is inversely proportional to the square root of the pulse width. For the 50 μm long window, coated facet laser noted above power limits of 5 W, 8 W and 22 W have been observed for pulse widths of 500 ns, 200 ns, and 50 ns pulses respectively. The latter case however is apparently not limited by catastrophic degradation but by parasitic leakage paths at high current levels that reduced the differential efficiency of the laser. Accordingly, it is readily apparent that window lasers retaining a transparent waveguide layer in the window regions that supports a waveguide transverse mode width greater than the active region have greatly increased catastrophic damage levels.

Another characteristic of window lasers with transparent waveguide layers is a reduction in the transverse far field divergence of the laser output beam. Nonwindow lasers have a transverse divergence, measured at full width half maximum, of at least 26° and typically about 34°, depending on the active region thickness, the refractive index difference between the active region and cladding layers, and other waveguiding parameters. Window lasers produced in accord with the present invention have transverse divergences of less that 25° and typically about 20°.

It is possible to estimate the increase in threshold due to scattering at the window region transition. We begin with an estimate for the scattering loss of an abrupt waveguide discontinuity. Using this expression and assuming that the ratio of mode widths in the window and nonwindow regions is the reciprocal of the ratio of far field pattern widths, we arrive at the expression:

$$\Delta P/P = 1 - 2[\theta\perp 1/\theta\perp 2 + \theta\perp 2/\theta\perp 1]^{-1} \quad (1)$$

where $\Delta P/P$ is the fractional scattered power, and $\theta\perp 1$ and $\theta\perp 2$ are the far field widths in the ordered and disordered waveguides, respectively. We have also assumed that the mode width in the plane of the active region remains the same in the window region. The scattering loss can be expressed as an equivalent optical loss averaged over the cavity length, L, by the relation:

$$\alpha_{sc} = (2/L)\ln(1/(1-\Delta P/P)) \quad (2)$$

where $\alpha_{sc}$ is the scattering loss. The factor of 2 accounts for the fact that there are 2 transition regions in a laser cavity. For the measured values of $\theta\perp 1$ and $\theta\perp 2$, we calculate $\Delta P/P = 0.15$, which gives $\alpha_{sc} = 12.8$ cm$^{-1}$. Next, the laser, without this additional loss, is moleled as having an operating threshold current versus geometry characteristic given by:

$$I_{th} = I_{tr} + B[2a_1L + \ln(1/R_1R_2)] \quad (3)$$

Where $I_{th}$ is the threshold current, $I_{tr}$ is the transparency current, B and $a_1$ are calculated material parameters (related to propagation loss and material gain), and $R_1$ and $R_2$ are the facet reflectivities. For devices fabricated from similar epitaxial material, we have measured $a_1 = 4.94$ cm$^{-1}$, B = 62.4 mA and $I_{tr} = 103.5$ mA. The increase in threshold current as a result of the scattering loss would be given as, $\Delta I_{th} = 2B\alpha_{sc}L$, which gives a 40 mA increase in threshold current for the parameters given above. The good agreement between this result and the previously measured values of 225 mA to 265 mA, a difference also of 40 mA, or an increase of 17% in threshold, is a clear indication that scattering loss explains some, if not all, of the paramount losses in this window waveguide structure. Further, the measurements also indicate that the measurements obtained from the far field are very accurate towards determining the device current threshold.

The window laser in accord with the present invention, i.e. having a transparent waveguide layer supporting a wider or broader guided transverse mode than the active region and coupled to the active region via a transition region has been seen to have a high power output and reduced far field divergence without substantially increased scattering propagation and diffraction losses in the laser cavity. An important but previously unrecognized feature of the instant invention is the availability of some freedom or a "window" within which to vary the extent of IID treatment time to correspondingly vary the extent of disordering in forming, on a reproducible basis, a buried waveguide window having good articulate optical coupling to an undisordered active region with reduced scattering loss compared to previously known window structures having litte or no waveguiding mechanism.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a buried planar passive waveguide structure formed in a plurality of semiconductor heterostructure layers, one of said layers within said structure having a lower energy bandgap than layers immediately adjacent thereto, said structure comprising a transparent single mode waveguide in said one layer formed by impurity induced disordering in combination with said immediately adjacent layers creating a longitudinal waveguide along at least a portion of said one layer having the highest refractive index at its core with diminishing refractive index from its core into adjacent layers.

2. The buried planar passive waveguide structure of claim 1 monolithically including an active medium having an active region with a plurality of optical cavities co-axially aligned and integrated with one end of said waveguide, said waveguide core having a energy bandgap level higher than that of said active region with low optical absorption at the gain wavelength of said active region.

3. In a semiconductor laser structure comprising a plurality of semiconductor layers, an active region formed between adjacent of said semiconductor layers and having an energy bandgap lower than said adjacent layers, mirror facets at each end of said structure to provide for optical feedback and further comprising means to disorder a portion of said structure active region lying adjacent to the mirror facets to induce at least initial interdiffusion of elemental constituents comprising said active region and said adjacent layers in said portion to form a passive waveguide therein having a one dimensional waveguide core region with an energy bandgap level higher than said active region lower energy bandgap and being substantially nonabsorbing to radiation at the operating wavelength of said active region.

4. In a semiconductor laser structure having a plurality of semiconductor layers including an active region therein having an energy bandgap lower than layers adjacent thereto with a passive waveguide section formed adjacent mirror facets at opposite ends of said structure and integral and in co-axial subsurface alignment with the active region of an adjacent active medium section comprising the steps of masking said active medium section leaving unmasked portions adjacent said mirror facets, disordering with a disordering element into said unmasked portions of the surface of said structure causing the interdiffusion of elemental constituents comprising said active region and said adjacent layers to effectively change said lower energy bandgap to a higher bandgap level, timing the disordering of said structure so that at least initial interdiffusion of elemental constituents comprising said active region and said adjacent layers in said passive waveguide section occurs while a portion of the active region in said active medium section remains undisordered due to said masking forming a one dimensional waveguide core region comprising said passive waveguide section in coaxial subsurface alignment with said undisordered active region in said active medium section such that said core region is nonabsorbing to radiation at the operating wavelength of said active medium.

5. In the semiconductor laser structure of claim 4 wherein said active medium section contains a single emitter.

6. In the semiconductor laser structure of claim 4 wherein said active medium section contains multiple emitters.

* * * * *